(12) United States Patent
Figueras et al.

(10) Patent No.: US 6,714,036 B2
(45) Date of Patent: Mar. 30, 2004

(54) MONITOR CIRCUITRY AND METHOD FOR TESTING ANALOG AND/OR MIXED SIGNAL INTEGRATED CIRCUITS

(75) Inventors: Joan Figueras, Sitges (ES); Fidel Muradali, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 25 days.

(21) Appl. No.: 10/193,949

(22) Filed: Jul. 11, 2002

(65) Prior Publication Data

US 2004/0008049 A1 Jan. 15, 2004

(51) Int. Cl.[7] .............................................. G01R 31/26
(52) U.S. Cl. .................................. 324/765; 324/158.1
(58) Field of Search .............................. 324/765, 158.1; 327/52, 54, 55, 56, 57; 365/207, 203; 714/733

(56) References Cited

U.S. PATENT DOCUMENTS

| | | | | |
|---|---|---|---|---|
| 4,150,311 A | * | 4/1979 | Matsuda et al. | ............... 327/55 |
| 4,158,241 A | * | 6/1979 | Takemae et al. | ............ 365/205 |
| 5,698,998 A | * | 12/1997 | Bodenstab | .................... 327/55 |
| 6,191,620 B1 | * | 2/2001 | Lattimore et al. | ............ 327/55 |

OTHER PUBLICATIONS

Brosa, Anna Maria and Figueras, Joan, "Digital Signature Proposal for Mixed–Signal Circuits," IEEE 0–7803–6546–1/00, Paper 39.3, ITC International Test Conference, 2000, pp. 1041–1050.

* cited by examiner

Primary Examiner—Vinh P. Nguyen
Assistant Examiner—Tung X. Nguyen

(57) ABSTRACT

Monitor circuitry for identifying an operational status of a device under test (DUT) includes a comparison circuit and a sense amplifier. The comparison circuit comprises a set of control transistors and a set of sense transistors. The control transistors include control input terminals for receiving reference signals to establish a testing condition with respect to a signal relationship between a first current flow and a second current flow. The sense transistors are operatively associated with the control transistors, such that biasing the sense input terminals of the sense transistors with sampled signals received from the DUT varies the signal relationship between the first current flow and the second current flow. The variation in the signal relationship is accelerated by the sense amplifier. The variation in the signal relationship is indicative of the operational status of the DUT at the sampling instance for acquiring the sampled signals.

24 Claims, 10 Drawing Sheets

MONITOR CIRCUITRY AND METHOD FOR TESTING ANALOG AND/OR MIXED SIGNAL INTEGRATED CIRCUITS

TECHNICAL FIELD

The invention relates generally to the testing of integrated circuits (ICs) and more particularly to monitor circuitry and a method for testing analog and/or mixed signal ICs.

BACKGROUND ART

Continuing increases in the complexity and density of analog and mixed signal integrated circuits (ICs) have imposed a challenge to the testing of circuitry within the circuits. A specific circuit design may exhibit a particular "signature" with respect to signal responses. While signature analysis has been successfully used to detect faults within digital ICs, the use of signature analysis for detecting faults within analog and mixed signal ICs is still in its infancy.

In current analog and mixed signal ICs testing techniques, the analog signals for testing are often distorted due to the need to transfer the signals to an off-chip environment. Test buses (e.g., IEEE 1149.4 standard), scan circuitry, oscilloscopes, and signal processing algorithms are often required, thereby adding to the problems encountered with parasitic loading and coupling.

One approach for testing analog and mixed signal ICs without the need to transfer the signals to the off-chip environment is to implement a built-in self-test (BIST) scheme. Since the analyses are performed on-chip, many of the problems associated with off-chip testings are eliminated. Brosa and Figueras in *Digital Signature Proposal for Mixed-Signal Circuits*, ITC International Test Conference, IEEE (2000), describe a system and method for testing mixed-signal ICs using a BIST scheme. According to the system, a zone detector is used to generate a control line that is swept across a Lissajous figure which is signatory of the IC. At each predefined period, a zero-crossing detector and counter counts the number of times the control line crosses the Lissajous figure. The number of crossings in the predefined period indicates the operational status of the IC. The zone detector for generating the control line consists of three operational amplifiers (op-amps) that are arranged in successive stages. One concern with the use of op-amps is the excessive area requirements of the op-amps, as compared to the IC under test, since each op-amp requires a significant amount of circuitry for implementation. Another concern is that the circuitry within the op-amps adds to the complexity and cost of manufacturing.

What is needed is a system and method for testing analog and mixed signal ICs, such that the size, complexity, and cost of manufacturing are reduced.

SUMMARY OF THE INVENTION

Monitor circuitry for identifying an operational status of a device under test (DUT) includes a comparison circuit and a sense amplifier. The comparison circuit comprises a set of control transistors and a set of sense transistors. The control transistors include control input terminals for receiving reference signals. The reference signals establish a testing condition that is characterized by a signal relationship between a first current flow and a second current flow. The sense transistors are operatively associated with the control transistors, such that biasing sense input terminals of the sense transistors with sampled signals received from the DUT varies the signal relationship between the first current flow and the second current flow. The variation in the signal relationship is accelerated by the sense amplifier. The variation in the signal relationship is indicative of the operational status of the DUT at the sampling instance of acquiring the sampled signals.

In one embodiment, the comparison circuit includes four transistors that are cooperatively arranged in a parallel configuration, including two control transistors and two sense transistors. A first conduction path for the first current flow is coupled to the source/drain regions of two of the four transistors. A second conduction path for the second current flow is coupled to the source/drain regions of the other two transistors. The first and second conduction paths are in parallel from the four transistors of the parallel configuration to the sense amplifier.

The parallel configuration may be arranged such that: (1) the two control transistors are connected to the first conduction path and the two sense transistors are connected to the second conduction path, (2) the two control transistors are connected to the second conduction path and the two sense transistors are connected to the first conduction path, and (3) one control transistor and one sense transistor are connected to the first conduction path while the other control transistor and the other sense transistor are connected to the second conduction path. Accordingly, each of the conduction paths may be coupled to the source/drain regions of: (1) two control transistors, (2) two sense transistors, or (3) one control transistor and one sense transistor.

Prior to testing, the monitor circuitry is initialized such that the first current flow at the first conduction path is equal to the second current flow at the second conduction path, if the two sampled signals satisfy a specific signal relationship condition. At a sampling instance, a set of reference signals is received at the control input terminals of the two control transistors. The reference signals may be constant voltages for controlling the current flows that are conducted through the two control transistors. The reference signals establish a testing condition with respect to the signal relationship between the first current flow and the second current flow. In an x-y plane, the reference signals are indicative of a boundary that divides two identifiable zones.

At a testing instance, a set of sampled signals are received at the sense input terminals of the two sense transistors. The sampled signals are analog signals which will determine the current flows that are conducted through the two sense transistors. The sampled signals vary the signal relationship between the first current flow and the second current flow. In the x-y plane, the sampled signals define a coordinate. The variation in the signal relationship indicates a location of the coordinate with respect to the boundary. In one testing scenario, the variation indicates whether the coordinate is on one side of the boundary because the first current flow is greater than the second current flow or on the other side of the boundary because the second current flow is greater than the first current flow.

The changes in the signal relationship between the first current flow and the second current flow are accelerated by the sense amplifier. The sense amplifier is configured to amplify a node voltage at a first node when the first current flow is greater than the second current flow or to amplify a node voltage at a second node when the second current flow is greater than the first current flow.

The monitor circuitry may also include output inverters. A first output inverter is coupled to the first node to invert the node voltage at the first node to provide a first digital output.

A second output inverter is coupled to the second node to invert the node voltage at the second node to provide a second digital output. The first digital output and the second digital output are complementary digital outputs.

In accordance with the inventive method, a sequence of first and second digital outputs is generated using sequential sampled signals. Moreover, the reference signals may be adjusted to define other boundaries in the x-y plane. Subsequent downstream processing compares at least one of the first and second digital outputs with a corresponding predetermined reference digital signal to determine the operational status of the DUT.

An advantage of the invention is that the operational status of the DUT can be determined by a relatively simple device. This is potentially important, since the simplicity of the device reduces the hardware requirements needed for testing. Accordingly, the test status of the DUT is determined in a relatively short period of time. Moreover, the cost overhead for manufacturing is significantly reduced relative to the prior art.

DETAILED DESCRIPTION

Figure 1:
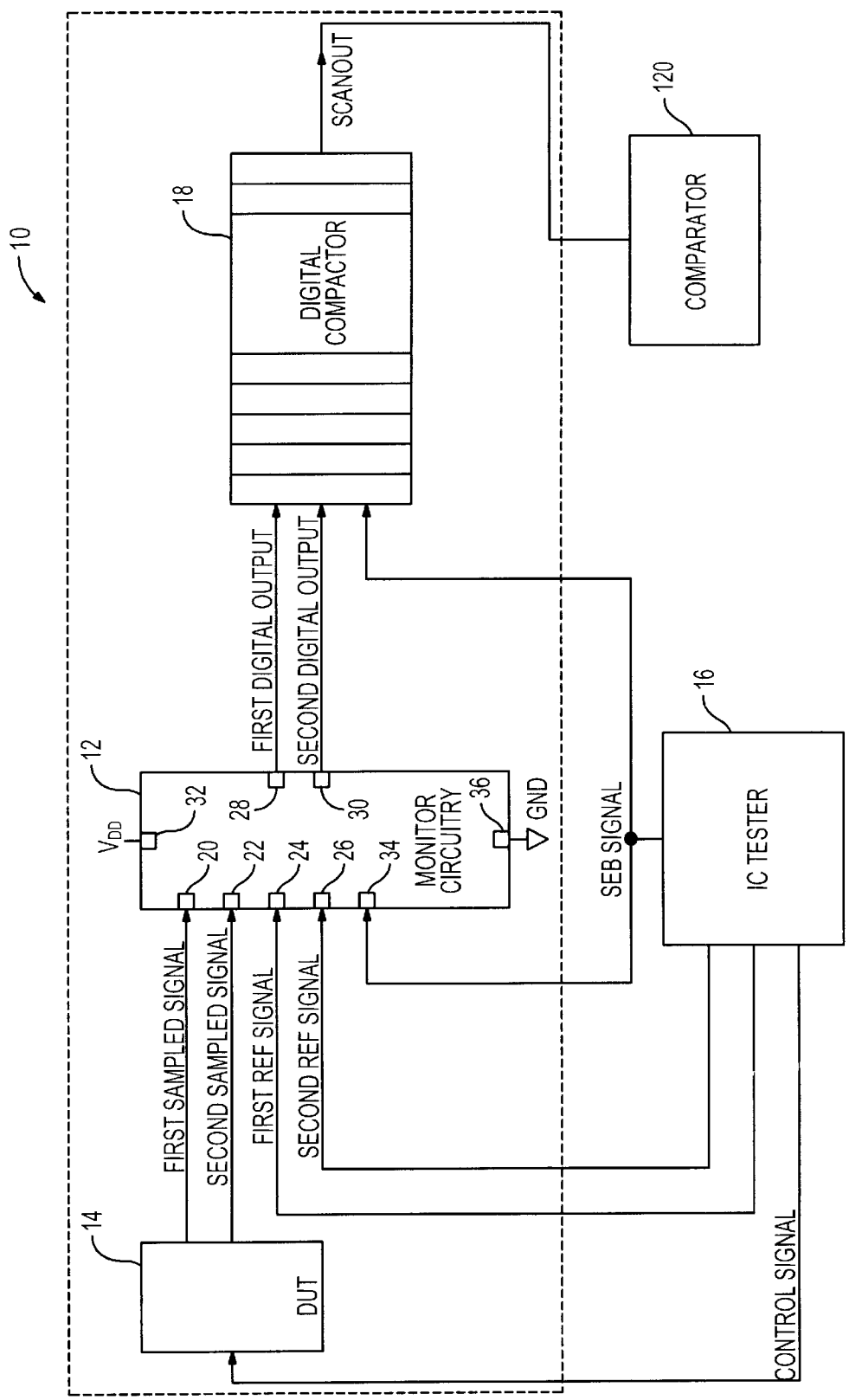
FIG. 1 is a system having monitor circuitry configured to receive a first sampled signal and a second sampled signal from a device under test (DUT) for determining an operational status of the DUT.

FIG. 1 shows an on-chip system 10 in which monitor circuitry 12 is configured to receive a first sampled signal and a second sampled signal from a device under test (DUT) 14 in order to determine an operational status of the DUT. The DUT may be a mixed signal device or an analog device. The system also includes an IC tester 16, a digital compactor 18 and a comparator 120. While the comparator is shown as being off-chip (i.e., outside of the dashed lines), the comparator may also be on-chip.

The monitor circuitry 12 is particularly suited for use as a built-in self-test (BIST) device in an on-chip environment. The monitor circuitry includes a first sampling terminal 20 and a second sampling terminal 22, a first reference terminal 24 and a second reference terminal 26, a first output terminal 28 and a second output terminal 30, a supply voltage ($V_{DD}$) input terminal 32, a sample and reset (SEB) terminal 34 and a ground terminal 36.

Figure 2:
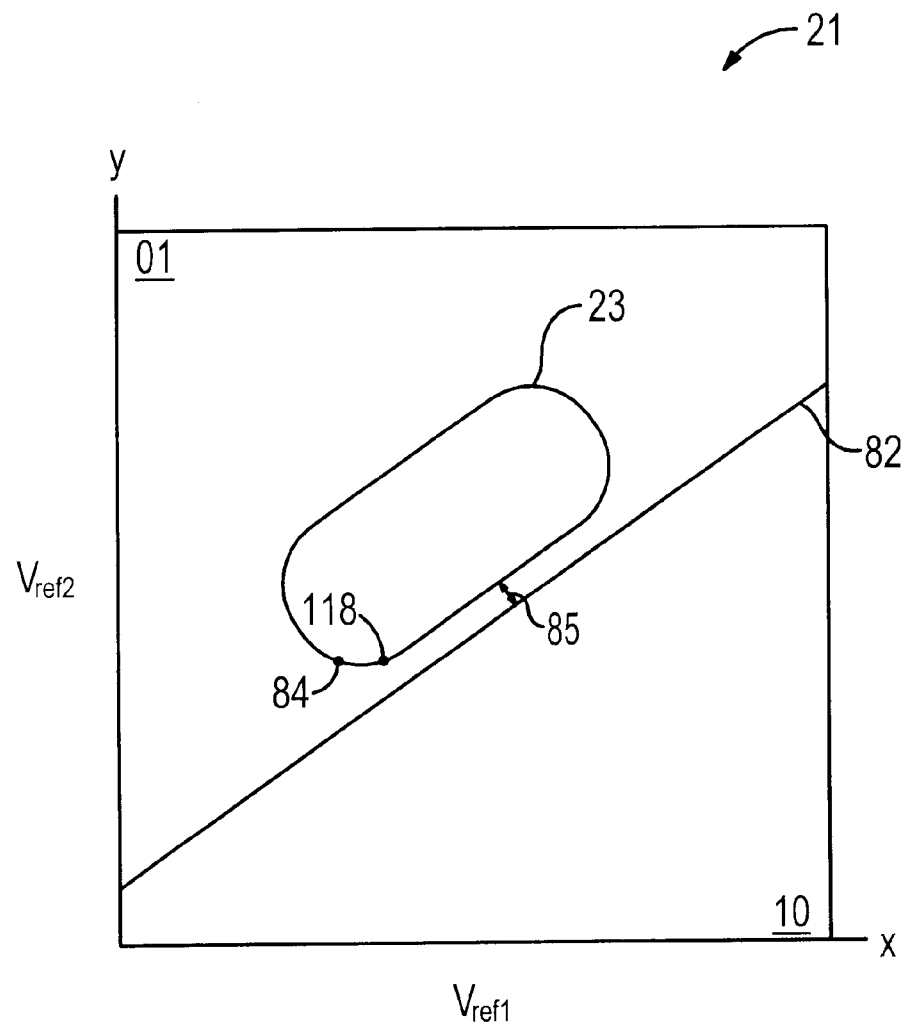
FIG. 2 is a representation of an x-y plane showing a Lissajous figure in relation to a boundary, the boundary being indicative of a testing condition of the monitor circuitry of FIG. 1.

The tester 16 is coupled to the DUT 14 to transmit a control signal. The control signal triggers transfers of first and second sampled signals from the DUT to the monitor circuitry 12. The first sampled signal is received by the monitor circuitry at the first sampling terminal 20. The second sampled signal is received by the monitor circuitry at the second sampling terminal 22. The sampled signals are analog signals and are indicative of two internal voltages within the DUT. Over a period of time, the sampled signals may define a Lissajous figure in an x-y plane. Using the x-y mode of an oscilloscope, the Lissajous figure may be visualized. FIG. 2 shows an x-y plane 21 having a Lissajous FIG. 23 that is characteristic of the DUT. For a DUT having linear characteristics, the Lissajous figure is likely to be elliptical.

In the monitor circuitry 12 of FIG. 1, the first reference terminal 24 and the second reference terminal 26 are coupled to the tester 16 to receive a first reference signal and a second reference signal. As will be explained in detail below, the reference signals establish a testing condition within the monitor circuitry. In a different embodiment, the first and second reference signals are received from the DUT 14, rather than from the tester. The reference signals that are received from the DUT may be associated with reference points coupled to divider-based logic having discrete hard-wired voltage values.

The SEB terminal 34 of the monitor circuitry 12 is connected to receive SEB signals from the tester 16 to trigger testing of the DUT 14. For each sampling time in a sequence of sampling times, a first digital output is generated at the first output terminal 28 and a second digital output is generated at the second output terminal 30. First and second digital outputs are continuously transferred to the digital compactor 18 for data compaction.

Figure 3:
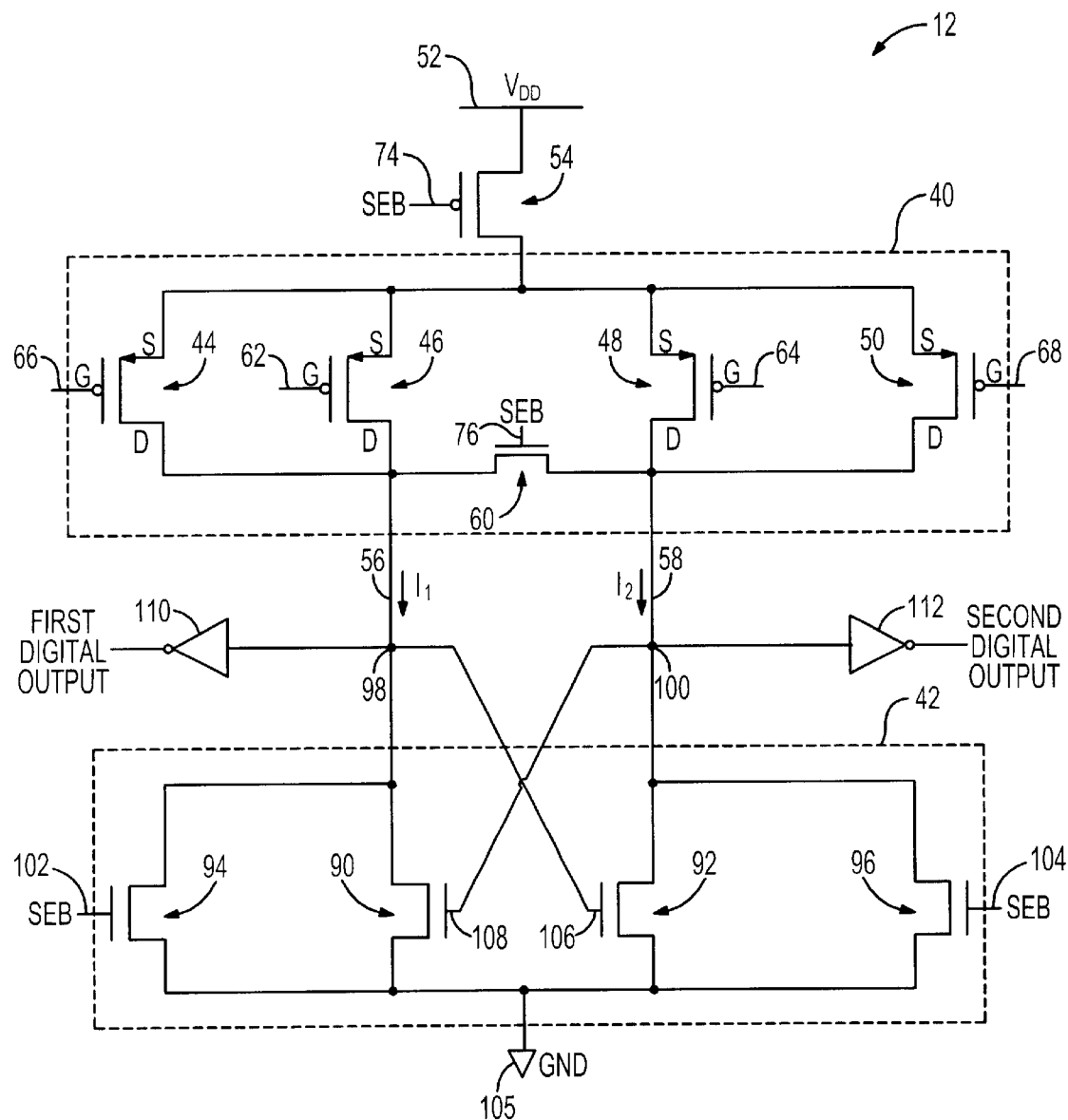
FIG. 3 is a schematic diagram of the monitor circuitry of FIG. 1 in accordance with a first embodiment of the invention.

In accordance with a first embodiment of the invention, FIG. 3 shows a schematic diagram of the monitor circuitry 12 of FIG. 1. The monitor circuitry includes a comparison circuit 40 (shown as a dashed block) and a sense amplifier 42 (also shown as a dashed block). In the embodiment of FIG. 3, the comparison circuit includes four transistors that are identified as transistors 44, 46, 48 and 50, but other embodiments may use a different number of transistors. The four transistors are cooperatively arranged in a parallel configuration. The four transistors may be conventional P-channel metal oxide semiconductor (PMOS) transistors.

A supply voltage ($V_{DD}$) rail 52 is coupled to the supply voltage input terminal 32 of FIG. 1. A first switching transistor 54 is arranged between the $V_{DD}$ rail and the source regions (S) of the four transistors 44–50. The configuration of the first switching transistor is such that it can be selectively manipulated to either enable current to conduct through the four transistors or disable current from being conducted through the four transistors. The first switching transistor is an N-channel MOS (NMOS) transistor, but this is not critical.

A first conduction path 56 for conducting a first current flow ($I_1$) is coupled to drain regions (D) of the transistors 44 and 46. A second conduction path 58 for conducting a second current flow ($I_2$) is coupled to drain regions (D) of the transistors 48 and 50. A second switching transistor 60 is coupled to the first conduction path and the second conduction path. The configuration of the second switching transistor is such that it can be selectively manipulated to provide a short-circuit condition or an open-circuit condition between the first conduction path and the second condition path. The second switching transistor may be an NMOS transistor.

Within the comparison circuit 40, any two of the four transistors 44–50 may be selected to be control transistors or sense transistors. In one exemplary embodiment, the transistor 46 is selected to be a first control transistor and the transistor 48 is selected to be a second control transistor. The first control transistor 46 is coupled to the first reference terminal 24 of FIG. 1 to receive the first reference signal at a gate region 62. The second control transistor 48 is coupled to the second reference terminal 26 of FIG. 1 to receive the second reference signal at a gate region 64. In the same exemplary embodiment, the remaining transistors 44 and 50 are first and second sense transistors. The first sense transistor 44 is coupled to the first sampling terminal 20 of FIG. 1 to receive the first sampled signal at a gate region 66. The second sense transistor 50 is coupled to the second sampling terminal 22 of FIG. 1 to receive the second sampled signal at a gate region 68.

The operation of the comparison circuit 40 may be described with reference to the monitor circuitry 12 of FIG. 3 and the timing diagram 70 of FIG. 4. Prior to testing, a high-level (i.e., logical high) SEB signal 72 is applied to the monitor circuitry to reset the comparison circuit. The high-level SEB signal is received at a gate region 74 of the first switching transistor 54 and at a gate region 76 of the second switching transistor 60. The first switching transistor and the second switching transistor are complementary switching transistors, such that the first switching transistor is activated when the second switching transistor is deactivated and the first switching transistor is deactivated when the second switching transistor is activated. The high-level SEB signal that is received at the gate region 74 of the first switching transistor deactivates the first switching transistor to establish an open-circuit condition between the $V_{DD}$ rail 52 and the four transistors 44–50. Accordingly, no current is conducted through any of the four transistors during the reset period. The high-level SEB signal that is received at the gate region 76 of the second switching transistor 60 activates the second switching transistor to establish a short-circuit condition between the first conduction path 56 and the second conduction path 58. During the short-circuit condition, the first current flow ($I_1$) at the first conduction path is equal to the second current flow ($I_2$) at the second conduction path.

Figure 4:
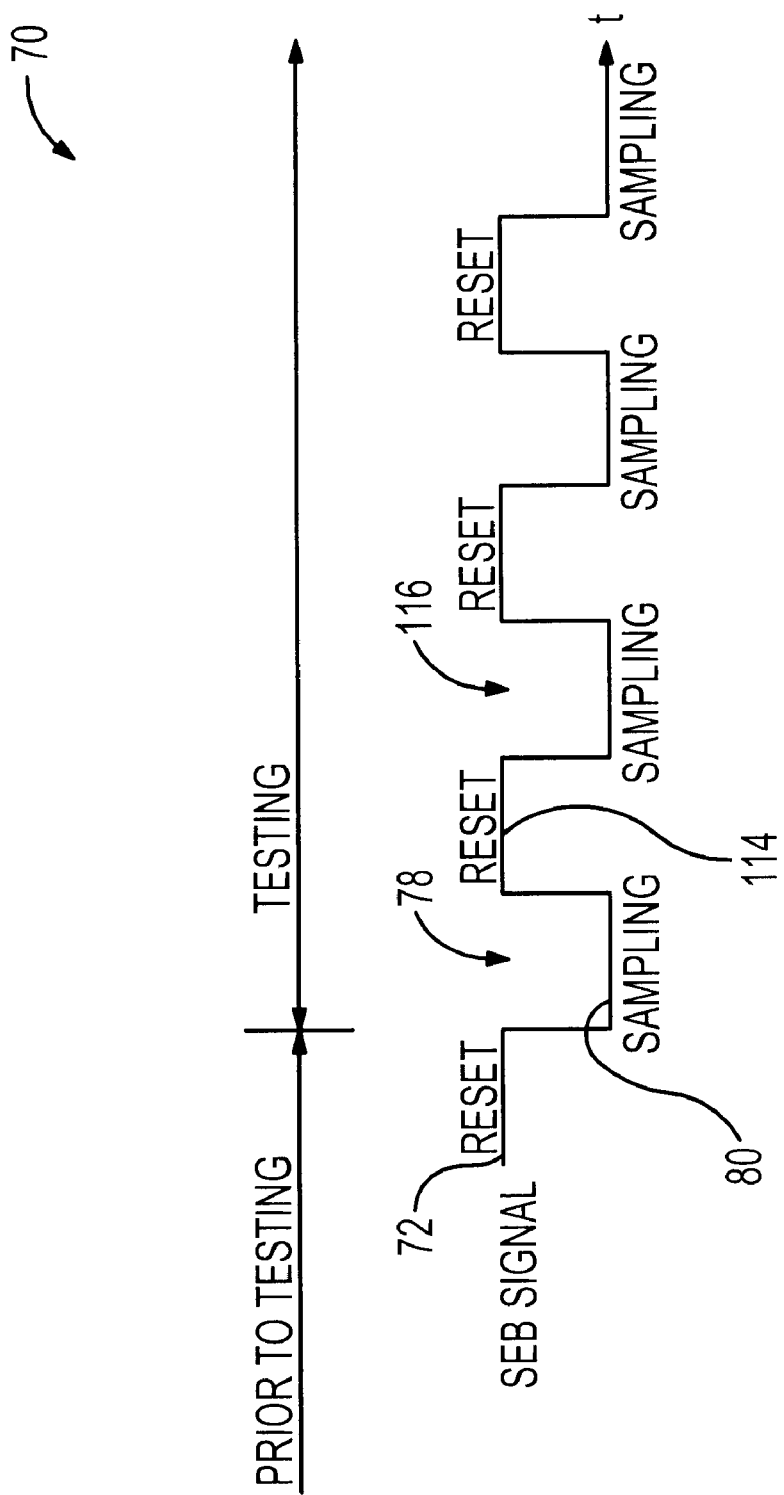
FIG. 4 is a timing diagram illustrating an operational sequence of the monitor circuitry of FIG. 3.

At a first sampling instance 78 of FIG. 4, a low-level (logical low) SEB signal 80 is applied to the monitor circuitry 12 of FIG. 3. The low-level SEB signal is received at the gate region 74 of the first switching transistor 54 and at the gate region 76 of the second switching transistor 60. The low-level SEB signal that is received at the gate region 74 of the first switching transistor activates the first switching transistor to establish a substantially short-circuit condition between the $V_{DD}$ rail 52 and the four transistors 4–50. Accordingly, current flows are conducted through the four transistors 44–50, depending on the levels of voltages that are applied to the respective gate regions for controlling the levels of current through the transistors. The low-level SEB signal that is received at the gate region 76 of the second switching transistor 60 deactivates the second switching transistor to establish an open-circuit condition between the first conduction path 56 and the second conduction path 58. During the open-circuit condition, the first conduction path is electrically coupled to the first sense transistor 44 and the first control transistor 46. The second conduction path is electrically coupled to the second control transistor 48 and the second sense transistor 50. Accordingly, at the sampling instance, the first current flow ($I_1$) is dependent upon conduction through the first sense transistor and the first control transistor. The second current flow ($I_2$) is dependent upon conduction through the second control transistor and the second sense transistor.

A testing condition that is characterized by a signal relationship between the first current flow ($I_1$) and the second current flow ($I_2$) is established by a specific level of current flow through the first control transistor 46 and a specific level of current flow through the second control transistor 48. The level of current flow through the first control transistor is regulated by the voltage level of the first reference signal received at the gate region 62. The level of current flow through the second control transistor is regulated by the voltage level of the second reference signal received at the gate region 64. The first and second reference signals are fixed voltages. In the x-y plane 21 of FIG. 2, a boundary 82 is indicative of the testing condition. The boundary is represented by a line that defines two identifiable zones. The zone that is on one side of the boundary may be identified as a zone 01 and the zone that is on the other side of the boundary may be identified as a zone 10. While the boundary is represented by a line as shown in FIG. 2, the boundary may be a curve that can be created by changing the reference signals for each consecutive sampling instance.

At the same first sampling instance 78 (FIG. 4), the level of current flow through the first sense transistor 44 is controlled by the voltage level of the first sampled signal at the gate region 66. The level of current flow through the second sense transistor 50 is controlled by the voltage level of the second sampled signal at the gate region 68. In the x-y plane 21 of FIG. 2, the first and second sampled signals define a coordinate 84 during the sampling instance. The coordinate is shown as being on the Lissajous FIG. 23, since the coordinate is identified during one sampling of the first and second sampled signals that form the Lissajous figure. The boundary 82 is shown as being at a distance 85 away from the Lissajous figure. The distance is indicative of a buffer zone to account for parametric variations exhibited by the DUT 14.

The monitor circuitry 12 of FIG. 3 is designed to provide outputs that indicate whether the coordinate 84 lies in the zone 01 above the boundary 82 or in the zone 10 below the boundary. Merely as an example, the testing condition set by the boundary may be one in which samples (Vref2) of the second sampled signal exceed simultaneously acquired samples (Vref1) by a factor of two. For a set testing condition, the outputs of the monitor circuitry will vary on the basis of the locations of coordinates defined by the samples acquired at the different sampling times, with each coordinate corresponding to a different sampling time. An output of the monitor circuitry indicates the relative position of a coordinate and the boundary by sensing the signal relationship of the first and second currents ($I_1$ and $I_2$).

The signal relationship between the first current flow ($I_1$) and the second current flow ($I_2$) is varied when there is a change in the contribution from at least one of the first sense transistor 44 and the second sense transistor 50. In the x-y plane 21 of FIG. 2, the variation in the signal relationship indicates a location of the coordinate 84 with respect to the boundary 82 at the sampling instance. In one testing scenario, the variation indicates whether the coordinate is within the zone 01, because the first current flow is greater than the second current flow, or within the zone 10, because the second current flow is greater than the first current flow.

The variation in the signal relationship between the first current flow ($I_1$) and the second current flow ($I_2$) is indicative of the test status of the DUT 14. As an example, FIG. 2 shows the coordinate 84 as being located within the zone 01 at the first sampling instance 78 (FIG. 4). As will be explained in detail below, the variation in the signal relationship is subsequently digitized into a pair of digital outputs. At least one digital output from the pair of outputs is then compared with a corresponding digital reference signal obtained from a defect-free IC to determine the test status of the DUT. This is repeated for a sequence of output pairs.

Figure 5:
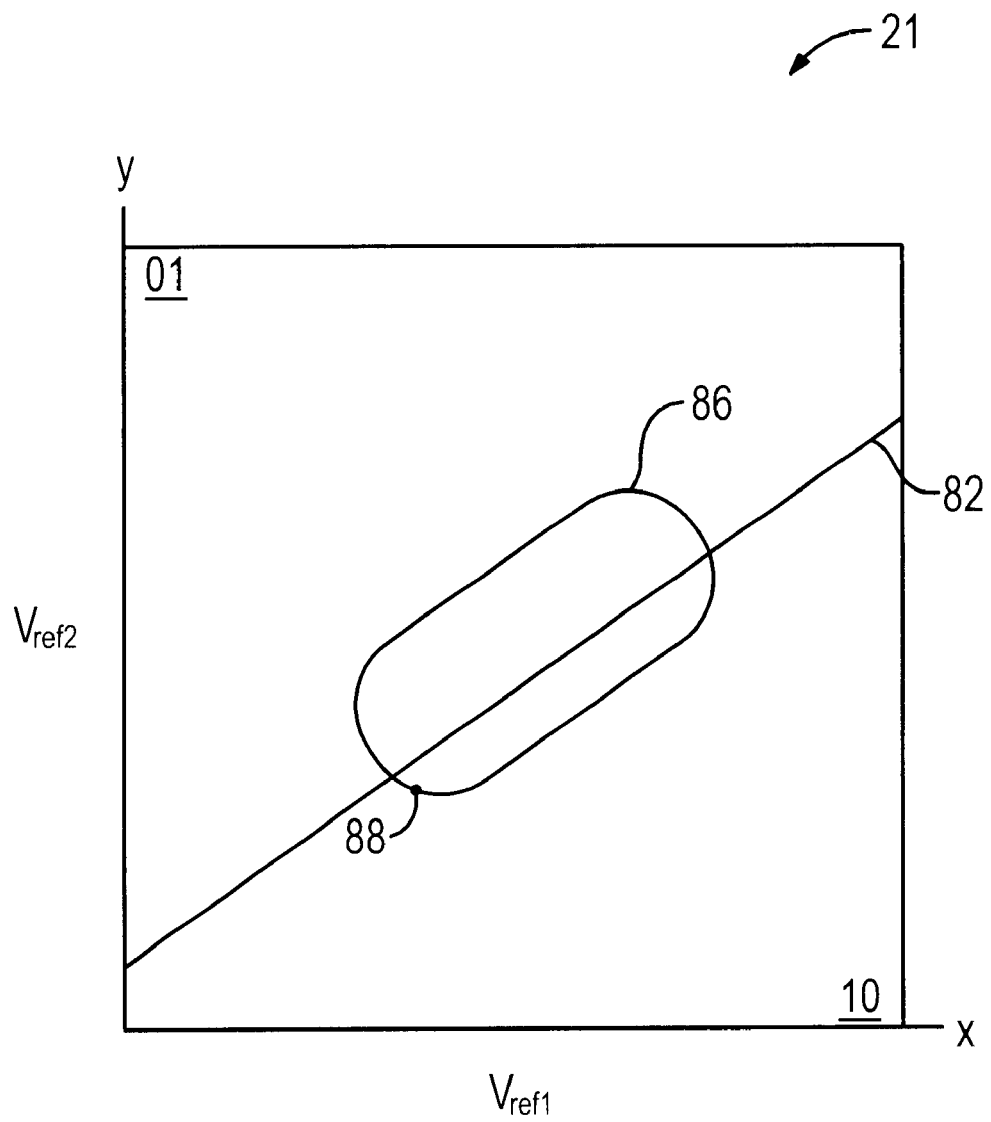
FIG. 5 is a representation of the x-y plane of FIG. 2 indicating that the DUT may be defective when a coordinate of the Lissajous figure is in a particular zone.

The status of the DUT 14 may be determined to be invalid if the signal relationship is one in which the second current flow is greater than the first current flow at the same first sampling instance 78 when the signal relationship of the defect-free IC is one in which the first current flow is greater than the second current flow. As an example, FIG. 5 shows the x-y plane 21 as having the same testing condition boundary 82 of FIG. 2. The x-y plane of FIG. 5 includes a Lissajous FIG. 86 of a defective DUT. The Lissajous FIG. 86 is at a different location from the Lissajous FIG. 23 of FIG. 2, since the Lissajous FIG. 86 is indicative of the defective DUT. At the same first sampling instance, a coordinate 88 is determined to be within the zone 10, rather than within the zone 01 as would have been acquired from the defectfree IC. The different location of the coordinate is characterized by the signal relationship when the second current flow is greater than the first current flow. The signal relationship indicates that the DUT may be defective.

The signal relationship between the first current flow ($I_1$) and the second current flow ($I_2$) is accelerated by the sense amplifier 42 of FIG. 3. The sense amplifier is coupled to the first and second conduction paths 56 and 58 from the comparison circuit 40. The sense amplifier includes a first accelerating transistor 90 and a second accelerating transistor 92, and a first enabling transistor 94 and a second enabling transistor 96. The first and second accelerating transistors may be PMOS transistors. The first and second enabling transistors may be NMOS transistors. The sense amplifier is configured to amplify a node voltage at a first node 98 when the first current flow is greater than the second current flow and to amplify a node voltage at a second node 100 when the second current flow is greater than the first current flow. The first node 98 is associated with the first conduction path 56, while the second node 100 is associated with the second conduction path 58.

The operation of the sense amplifier 42 may be described with reference to the monitor circuitry 12 of FIG. 3 and the timing diagram 70 of FIG. 4. Prior to testing, the high-level SEB signal 72 at the first switching transistor 54 and at the second switching transistor 60 is also received at the sense amplifier to reset the amplifier. The high-level SEB signal is coupled to a gate region 102 of the first enabling transistor 94 and a gate region 104 of the second enabling transistor 96. The high-level SEB signal at the gate region 102 activates the first enabling transistor to establish a short-circuit condition between the first conduction path 56 and electrical ground 105. Similarly, the high-level SEB signal at the gate region 104 activates the second enabling transistor to establish a short-circuit condition between the second conduction path 58 and electrical ground. Accordingly, the first conduction path and the second conduction path are both shorted to ground in addition to being linked by the short-circuit condition that is established by the second switching transistor 60 during the reset period. Consequently, the first current flow is equal to the second current flow.

At the first sampling instance 78 of FIG. 4, the low-level SEB signal at the first switching transistor 54 and at the second switching transistor 60 is also received at the gate region 102 of the first enabling transistor 94 and at the gate region 104 of the second enabling transistor 96. The low-level SEB signal deactivates the first and second enabling transistors 94 and 96 to establish open-circuit conditions at the first and second enabling transistors. Accordingly, each of the first conduction path 56 and the second conduction path 58 is coupled to both the first and second accelerating transistors 90 and 92.

The first and second accelerating transistors 90 and 92 are cooperatively configured to accelerate the variation in the signal relationship between the first current flow ($I_1$) and the second current flow ($I_2$) by amplifying a voltage differential between the first node 98 and the second node 100. The acceleration of the variation in the signal relationship will be described by way of an example in which the first current flow ($I_1$) is greater than the second current flow ($I_2$). The higher-level first current flow is reflected by a higher voltage level at the first node 98 and at a gate region 106 of the second accelerating transistor 92. The lower level of the second current flow is reflected by a lower voltage level at the second node 100 and at a gate region 108 of the first accelerating transistor 90. The higher voltage level at the gate region 106 activates the second accelerating transistor 92 to establish a conductive condition between the second node 100 and electrical ground 105. While the second accelerating transistor is activated, the second current flow is conducted to ground. Consequently, the node voltage at the second node is equalized to ground potential. As the second current flow is being conducted to ground, the voltage level at the gate region 108 of the first accelerating transistor 90 is further lowered due to lack of current contribution from the second current flow to the gate region of the first accelerating transistor. The drop in voltage at the gate region 108 deactivates the first accelerating transistor 90 to establish an open-circuit condition between the first node 98 and ground. With the first accelerating transistor being in the open-circuit condition, the node voltage at the first node is equalized to the sum voltages of the first sense transistor 44 and the first control transistor 46. Since the node voltage at the second node 100 is equal to the ground potential, the node voltage at the first node 98 is amplified when compared to the node voltage at the second node.

The monitor circuitry 12 also includes a first output inverter 110 and a second output inverter 112. The first output inverter is coupled to the first node 98 to invert the node voltage at the first node to a first digital output. The second output inverter 112 is coupled to the second node 100 to invert the node voltage at the second node to a second digital output. The first digital output and the second digital output are complementary digital outputs and are transmitted to the digital compactor 18 (FIG. 1) via respective first and second output terminals 28 and 30. The pair of the first and second digital outputs can be strobed at the same rate as the SEB signals. The digital compactor is configured to store multiple first and second digital outputs to generate a set of the first and second digital outputs.

Subsequent to generating the first and second digital outputs, a high-level SEB signal 114 of FIG. 4 is applied to the monitor circuitry 12 of FIG. 3 to reset the circuitry for enabling a next sampling at a second sampling instance 116. At the second sampling instance, a new pair of sampled signals is received at the comparison circuit 40. The new sampled signals vary the signal relationship between the first current flow ($I_1$) and the second current flow ($I_2$). In one exemplary embodiment, the new sampled signals define a coordinate 118 within the x-y plane 21 of FIG. 2. The variation in the signal relationship indicates that the coordinate is within the zone 01, because the first current flow is greater than the second current flow. The variation is accelerated by the sense amplifier. A new pair of digital outputs is generated and transmitted to the digital compactor 18. Subsequently, the testing sequence is repeated with another pair of sampled signals to generate first and second digital outputs. In one embodiment, the monitor circuitry is configured to operate at a speed of 100 MHz. That is, the monitor circuitry can process 50 million samplings from the Lissajous figure within a one second interval.

When a threshold number of the first and second digital outputs is reached, the set of first and second digital outputs is scanned-out of the digital compactor 18 to the comparator 120 of FIG. 1. In one embodiment, the comparator is configured to compare the set of first and second digital outputs with a corresponding set of first and second predetermined digital reference signals to determine the operational status of the DUT. In another embodiment, only the first or second digital output from the set of first and second digital outputs is compared with its corresponding first or second predetermined digital reference signal, since the first and second digital outputs are complementary digital outputs. As indicated earlier, if the signal relationship for a defective DUT is such that the second current flow is greater than the first current flow, the "incorrect" signal relationship will be indicated by the digital outputs. When the digital outputs are compared to the predetermined digital reference signals, the mismatch will be noted. In one embodiment, the comparison sequence is tolerant to a finite range of mismatches before the DUT is declared as being faulty.

Figure 6:
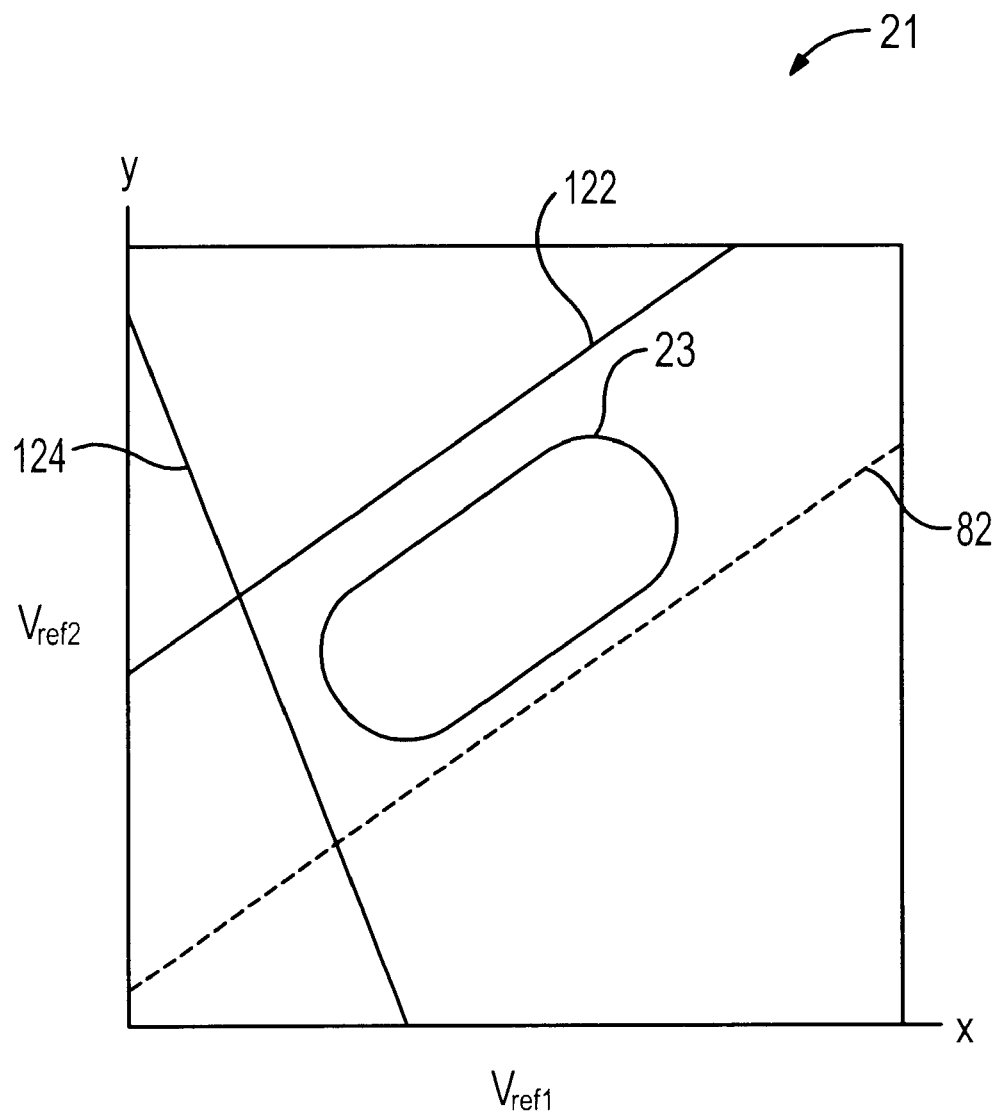
FIG. 6 is a representation of the x-y plane of FIG. 2 illustrating multiple different boundaries.

Specific levels of current flow through the first and second control transistors 46 and 48 of the monitor circuitry 12 of FIG. 3 establish the boundary 82 of FIG. 2 for defining the testing condition, but a different boundary may be established to define a new testing condition by varying the levels of current through the first and second control transistors 46 and 48. The variation in the levels of current is attained by applying different constant voltages at the gate regions 62 and 64 of respective first and second control transistors 46 and 48. The variation establishes different x-y offsets, so that the slope of the boundary can be changed or the boundary can be moved upwardly or downwardly within the x-y plane. FIG. 6 shows a boundary 122 in the x-y plane 21 that is moved upwardly with respect to the boundary 82 of FIG. 2. The boundary 82 in FIG. 6 is shown as a dashed line to provide a perspective of the upward movement. The new boundary 122 defines two identifiable zones and enables multiple samplings of the Lissajous FIG. 23 (that is indicative of the DUT 14) to determine whether the Lissajous figure falls within one of the two identifiable zones. While the new boundary 122 is represented by a line as shown in FIG. 6, the new boundary may be a curve.

In another embodiment, the new boundary may be established by changing the connection order of the reference signals and the sampled signals with respect to the first conduction path 56 and the second conduction path 58 within the monitor circuitry 12 of FIG. 3. As shown in FIG. 6, the change in the connection order changes the slope of the boundary 82 to form a new boundary 124. In one connection order, the new boundary is established by selecting the transistors 44 and 46 to be respective first and second control transistors and the transistors 48 and 50 to be respective first and second sense transistors. This way, the first conduction path is coupled to two control transistors and the second conduction path is coupled to two sense transistors. In another connection order, the new boundary is established by selecting the transistors 44 and 46 to be respective first and second sense transistors and the transistors 48 and 50 to be respective first and second control transistors. Still, in another connection order, the new boundary is established by selecting the transistors 46 and 48 to be respective first and second sense transistors and the transistors 44 and 50 to be respective first and second control transistors. The changes to the connection orders may be performed by a switching multiplexer.

The monitor circuitry may be adjusted multiple times in order to test the same sampling sequence for a variety of boundaries. As an alternative, the variety of boundaries may be established by an equal number of monitor circuits.

Figure 7:
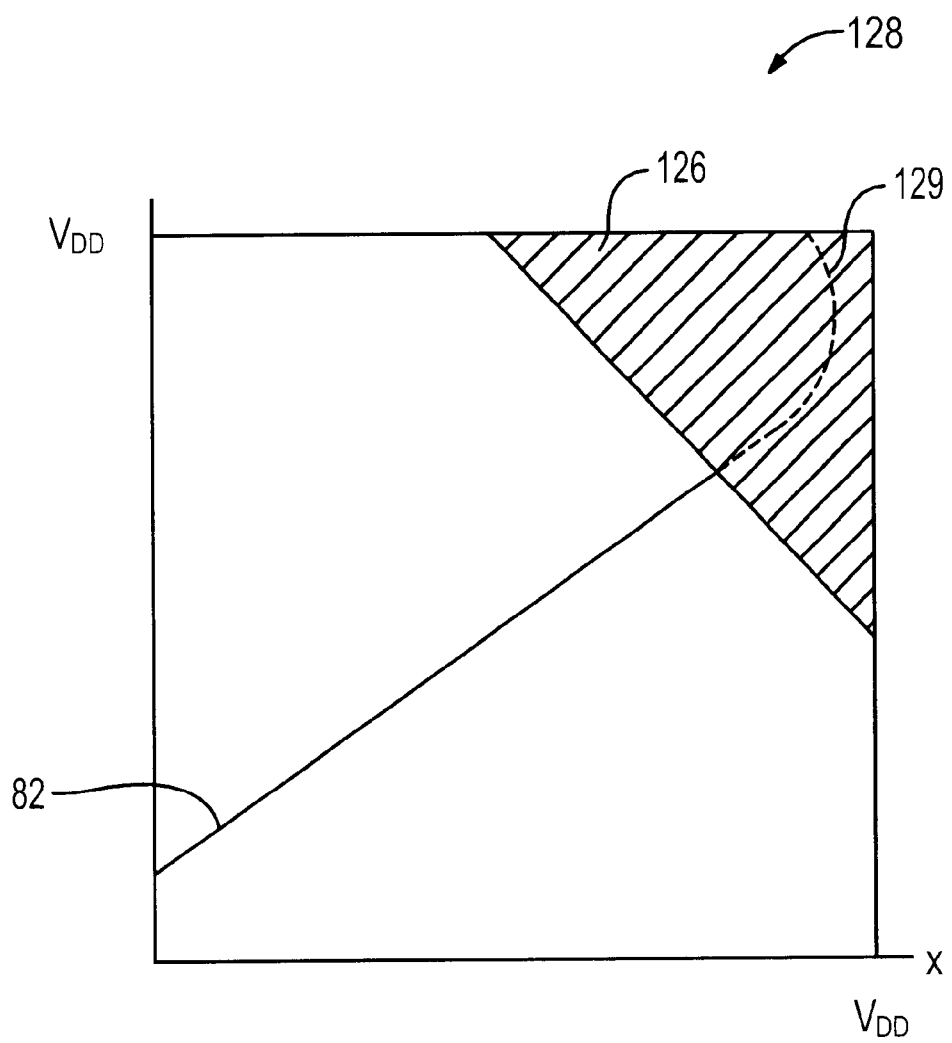
FIG. 7 is a representation of an x-y plane having an unreachable zone in which a boundary may not be effectively established by the monitor circuitry of FIG. 3.

As indicated earlier, the transistors 44–50 of the comparison circuit 40 of FIG. 3 are PMOS transistors. Due to the inherent limitations of the PMOS transistors, the performance of the comparison circuit is degraded when the voltage level that is applied to each of the four transistors 44–50 is near $V_{DD}$. In such an event, there is an unreachable zone within the x-y plane where the boundary for defining the two zones cannot be effectively established. Consequently, the locations of coordinates that are indicative of a Lissajous figure may not be properly identified as being within one of the two predetermined zones, if the Lissajous figure also falls within the unreachable zone. FIG. 7 shows an unreachable zone 126 (indicated by cross-hatching) in an x-y plane 128. The unreachable zone includes a non-linear portion 129 (shown in dash) of the boundary 82. Around the non-linear portion, the boundary for establishing the two zones cannot be effectively established.

Figure 8:
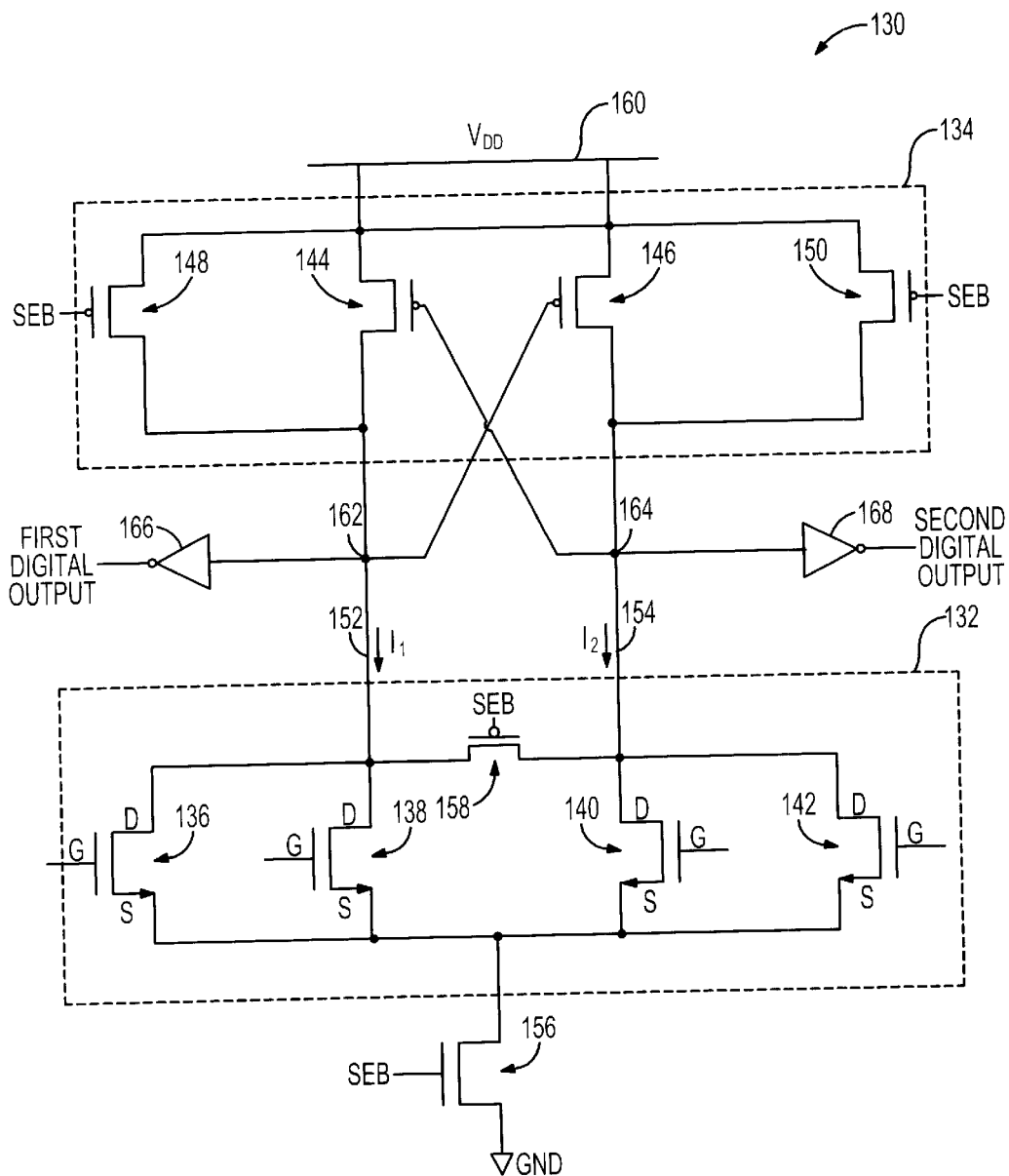
FIG. 8 is a schematic diagram of the monitor circuitry of FIG. 1 in accordance with a second embodiment of the invention.

The problem associated with properly defining a boundary within the unreachable zone is solved by a comparison circuit that uses NMOS transistors. FIG. 8 shows a schematic diagram of a monitor circuitry 130 in accordance with a second embodiment of the invention. The monitor circuitry 130 includes a comparison circuit 132 and a sense amplifier 134. The comparison circuit includes four transistors that are identified as NMOS transistors 136, 138, 140 and 142. The sense amplifier includes a first accelerating transistor 144 and a second accelerating transistor 146 that are NMOS transistors, and a first enabling transistor 148 and a second enabling transistor 150 that are PMOS transistors.

Similar to the comparison circuit 40 of FIG. 3, any two of the four transistors 136–142 of the comparison circuit 132 of FIG. 8 may be selected to be control transistors or sense transistors. In one exemplary embodiment, the transistor 138 is selected to be the first control transistor and the transistor 140 is selected to be the second control transistor. The transistor 136 is the first sense transistor and the transistor 142 is the second sense transistor. A first conduction path 152 for a first current flow ($I_1$) and a second conduction path 154 for a second current flow ($I_2$) are coupled between the comparison circuit 132 and the sense amplifier 134. The first conduction path 152 is coupled to the comparison circuit at drain regions (D) of the first sense transistor 136 and the first control transistor 138. The second conduction path 154 is coupled to the comparison circuit at drain regions (D) of the second control transistor 140 and the second sense transistor 142.

During operation, a high-level SEB signal is received at a first switching transistor 156 and at a second switching transistor 158. The high-level SEB signal at the first switching transistor activates the first switching transistor to establish a short-circuit condition between the source regions of the four transistors 136–142 and ground to enable currents to flow from a $V_{DD}$ rail 160 to ground. The high-level SEB signal that is received at the second switching transistor 158 deactivates the second switching transistor to establish an open-circuit condition. During the open-circuit condition, the first conduction path 152 is electrically coupled to the first sense transistor 136 and the first control transistor 138. The second conduction path 154 is electrically coupled to the second control transistor 140 and the second sense transistor 142.

A testing condition that is characterized by a signal relationship between the first current flow ($I_1$) through the first conduction path 152 and the second current flow ($I_2$) through the second conduction path 154 is established by a specific level of current flow through the first control transistor 138 and a specific level of current flow through the second control transistor 140. The testing condition may be represented by the boundary 82 within the x-y plane 21 of FIG. 2. As described earlier, the boundary defines two identifiable zones (e.g., zone 01 and zone 10) within the x-y plane. The signal relationship is considered when samples are applied to the first sense transistor 136 and the second sense transistor 142. The current flow through the first sense transistor is controlled by the first sampled signal at a gate region of the first sense transistor. The current flow through the second sense transistor is controlled by the second sampled signal at a gate region of the second sense transistor. In one exemplary embodiment, the first and second sampled signals define the coordinate 84 within the x-y plane 21. The variation in the signal relationship indicates the location of the coordinate with respect to the boundary 82. In one testing scenario, the variation indicates whether the coordinate is on one side of the boundary within the zone 01, because the first current flow is greater than the second current flow, or is on the other side of the boundary within the zone 10, because the second current flow is greater than the first current flow.

The signal relationship between the first current flow ($I_1$) and the second current flow ($I_2$) is accelerated by the sense amplifier 134 of FIG. 8. The sense amplifier is coupled to the first and second conduction paths 152 and 154. Similar to the sense amplifier 42 of FIG. 3, the sense amplifier 134 is configured to amplify a node voltage at a first node 162 when the first current flow is greater than the second current flow and to amplify a node voltage at a second node 164 when the second current flow is greater than the first current flow. A first output inverter 166 is coupled to the first node 162 to invert the node voltage at the first node to generate a first digital output. A second output inverter 168 is coupled to the second node 164 to invert the node voltage at the second node to generate a second digital output. The first digital output and the second digital output are complementary digital outputs that are transmitted to the digital compactor 18 of FIG. 1.

Figure 9:
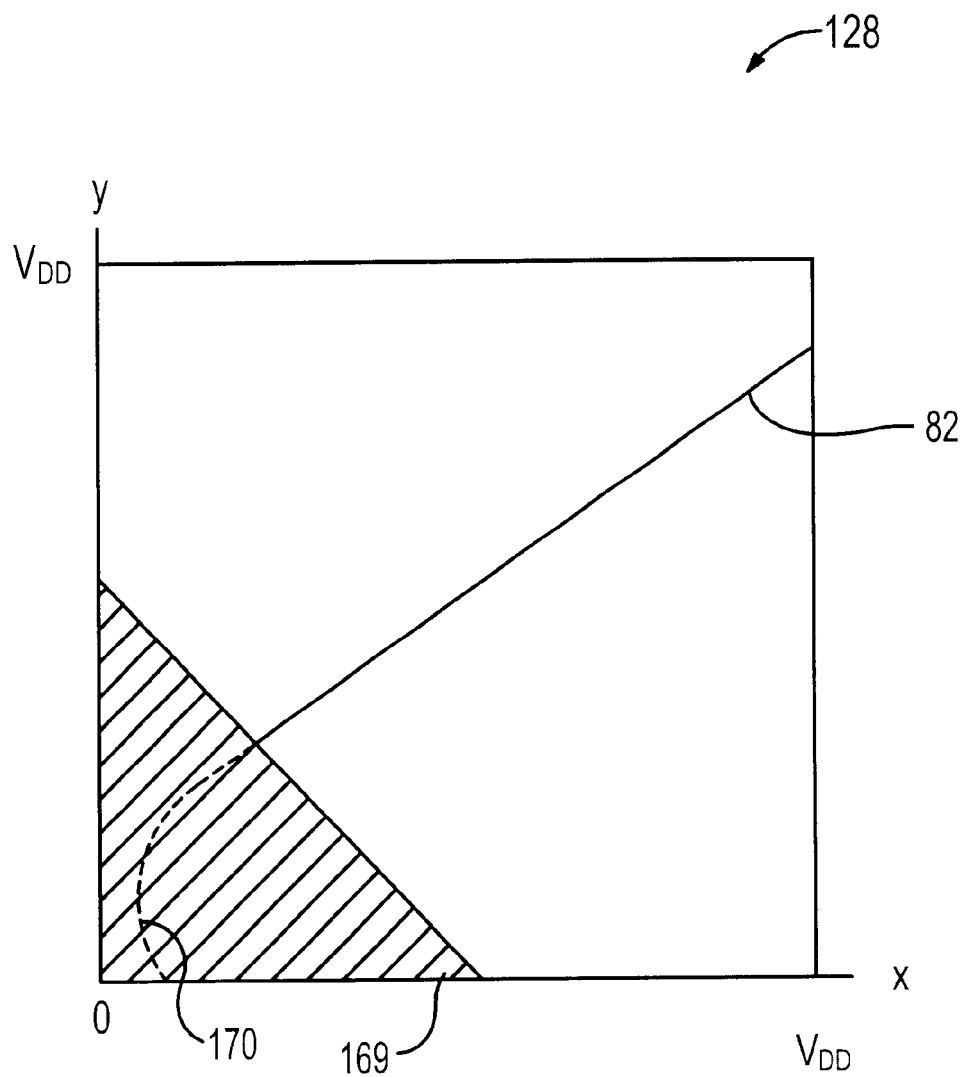
FIG. 9 is a representation of an x-y plane having an unreachable zone in which a boundary may not be effectively established by the monitor circuitry of FIG. 8.

While the comparison circuit 132 of FIG. 8 can effectively establish a boundary for defining two identifiable zones when the voltages that are applied to each of the four transistors 136–142 is near $V_{DD}$, the performance of the comparison circuit is degraded when the voltages are near zero. The degradation in performance is due to the inherent limitations of the NMOS transistors 136–142. When the voltage level is near zero, there is an unreachable zone within the x-y plane where the boundary for defining the two zones cannot be effectively established. Consequently, the locations of coordinates that are indicative of a Lissajous figure may not be properly identified as being within one of the two pre-determined zones, if the Lissajous figure also falls within the unreachable zone. FIG. 9 shows an unreachable zone 169 (indicated by cross-hatching) in the x-y plane 128. The unreachable zone includes a non-linear portion 170 (shown in dash) of the boundary 82. Around the non-linear portion, the boundary for establishing the two zones cannot be effectively established. However, the problem associated with properly defining the boundary within the unreachable zone is solved by the use of PMOS transistors within the comparison circuit 40 of FIG. 3.

Figure 10:
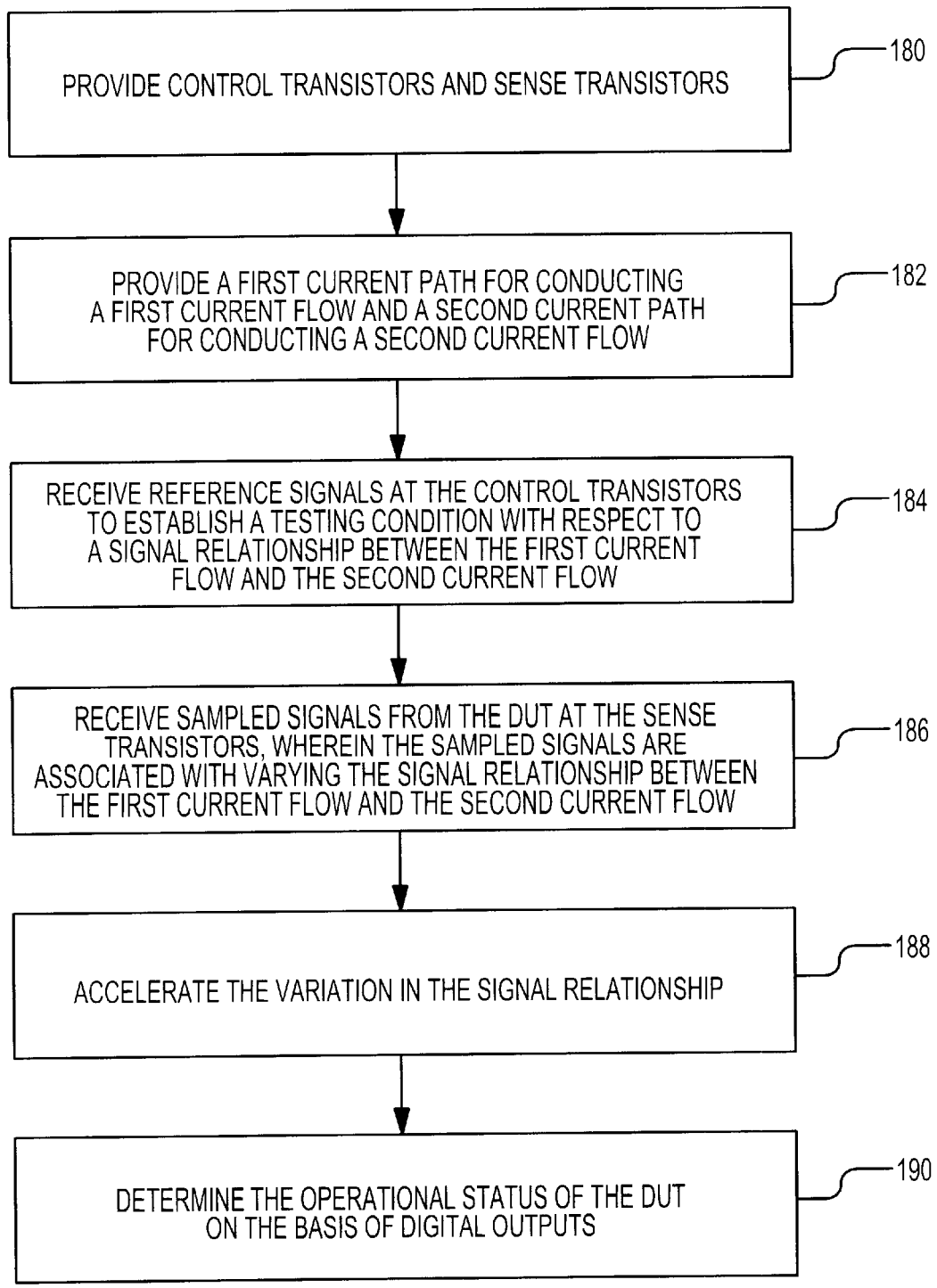
FIG. 10 is a process flow diagram for identifying the test status of the DUT in accordance with the invention.

The method for identifying the operational status of a DUT is described with reference to the process flow diagram of FIG. 10. In step 180, control transistors and sense transistors are provided. As shown by the monitor circuitry 12 of FIG. 3, there are two control transistors and two sense transistors. The four transistors are arranged in parallel. In the monitor circuitry, the transistor 46 is the first control transistor and the transistor 48 is the second control transistor. The transistor 44 is the first sense transistor and the transistor 50 is the second sense transistor.

In step 182, a first current path ($I_1$) for conducting a first current flow is provided. A second current path ($I_2$) for conducting a second current flow is also provided. The step of providing the first current path and the second current path includes connecting the first current path to source/drain regions of any two of the four transistors and connecting the second current path to source/drain regions of the other two transistors. In the monitor circuitry 12 of FIG. 3, the first conduction path 56 is coupled to the drain regions of the first sense transistor 44 and the first control transistor 46. The second conduction path 58 is coupled to the drain regions of the second control transistor 48 and the second sense transistor 50.

In step 184, reference signals are received at the control transistors to establish a testing condition with respect to a signal relationship between the first current flow and the second current flow. The reference signals are constant levels of voltages for controlling the current flows that are conducted through the control transistors. The reference signals may define a number of regions in an x-y plane, including the zone 01 and the zone 10 within the x-y plane 21 of FIG. 2.

In step 186, sampled signals are received from the DUT. The sampled signals are analog signals which are applied to control the current flows through the sense transistors. In the x-y plane, the sampled signals define a coordinate, such as the coordinate 84 that is shown within the x-y plane 21 of FIG. 2. The sampled signals vary the signal relationship between the first current flow and the second current flow. The resulting signal relationship indicates the region in which the sampled coordinate resides. In the embodiment of FIG. 2, the coordinate 84 is identified as being located within the zone 01 when the signal relationship is such that the first current flow is greater than the second current flow.

In step 188, the variation in the signal relationship is accelerated by a sense amplifier, such as the sense amplifier 42 of FIG. 3. Finally, the status of the DUT is determined in step 190 on the basis of the digital outputs from the monitor circuitry.

What is claimed is:

1. Monitor circuitry for identifying an operational status of a device under test (DUT) comprising:
   a comparison circuit having a set of control transistors and a set of sense transistors, said control transistors having control input terminals connected to receive reference signals for establishing a testing condition with respect to a signal relationship between a first current flow and a second current flow, said sense transistors being operatively associated with said control transistors and having sense input terminals such that biasing said sense input terminals with sampled signals received from said DUT varies said signal relationship, wherein variations in said signal relationship are indicative of said operational status of said DUT; and a sense amplifier operationally coupled to said comparison circuit, said sense amplifier being configured to accelerate said variations in said signal relationship.

2. The monitor circuitry of claim 1 wherein said control transistors and said sense transistors are arranged in a parallel configuration that includes two said control transistors and two said sense transistors.

3. The monitor circuitry of claim 2 further comprising a first conduction path for conducting said first current flow and a second conduction path for conducting said second current flow, said first and second conduction paths being arranged in parallel between said parallel configuration and said sense amplifier, each of said first conduction path and said second conduction path being coupled to source/drain regions of:
  (1) two said control transistors, or
  (2) two said sense transistors, or
  (3) one said control transistor and one said sense transistor.

4. The monitor circuitry of claim 1 wherein said first current flow is equal to said second current flow when said sampled signals satisfy a specific signal relationship.

5. The monitor circuitry of claim 1 wherein said reference signals that are received at control input terminals of said control transistors are constant levels of voltages for controlling current flows through said control transistors.

6. The monitor circuitry of claim 5 wherein said reference signals are selected to define a boundary in an x-y plane, said boundary being enabled to identify two zones in said x-y plane.

7. The monitor circuitry of claim 6 wherein said sampled signals are received at sense input terminals of said sense transistors at a sampling instance to provide said variation to said signal relationship, said sampled signals being analog signals that are applied to control current flows through said sense transistors, said sampled signals defining a coordinate in said x-y plane.

8. The monitor circuitry of claim 7 wherein said variation is indicative of a location of said coordinate with respect to said boundary.

9. The monitor circuitry of claim 8 further comprising output circuitry for indicating when said first current flow is greater than said second current flow and when said second current flow is greater than said first current flow.

10. The monitor circuitry of claim 9 wherein said sense amplifier is configured to amplify a first node voltage at a first node when said first current flow is greater than said second current flow, said sense amplifier also being configured to amplify a second node voltage at a second node when said second current flow is greater than said first current flow, said first node being associated with said first conduction path and said second node being associated with said second conduction path.

11. The monitor circuitry of claim 10 further comprising a first output inverter and a second output inverter, said first output inverter being coupled to said first node and configured to invert said first node voltage to generate a first digital output, said second output inverter being coupled to said second node and configured to invert said second node voltage to generate a second digital output, said first and second digital outputs being complementary digital signals.

12. The monitor circuitry of claim 11 wherein said first and second output inverters are operatively coupled to a processing unit for comparing at least one of said first and second digital outputs with a corresponding first and second predetermined reference digital signal to determine said operational status of said DUT.

13. A testing circuit for determining a test status of an integrated circuit (IC) comprising:
  a plurality of control transistors, said control transistors having control input regions for receiving reference signals to establish a predefined condition with respect to a signal relationship between a first current flow and a second current flow; and
  a plurality of sense transistors, said sense transistors being operatively associated with said control transistors and having sense input regions for receiving IC signals to provide a deviation to said signal relationship between said first current flow and said second current flow, said deviation being indicative of said test status of said IC.

14. The testing circuit of claim 13 wherein each of said first current flow and said second current flow is established by current flows that are conducted through:
  (1) said control transistors, or
  (2) said sense transistors, or
  (3) a combination of at least one said control transistor and at least one said sense transistor.

15. The testing circuit of claim 13 wherein said deviation is indicative of a location of an x-y coordinate in relation to a boundary in an x-y space, said boundary being enabled to define a plurality of regions in said x-y space.

16. The testing circuit of claim 15 wherein said x-y coordinate is defined by said IC signals and said boundary is defined by said reference signals.

17. The testing circuit of claim 15 wherein said first current flow is greater than said second current flow when said x-y coordinate is in a first region, said second current flow being greater than said first current flow when said x-y coordinate is in a second region, said first and second regions being different regions in said x-y space.

18. A method for identifying an operational status of a device under test (DUT) comprising:
  providing a plurality of transistors, including control transistors and sense transistors;
  receiving reference signals at said control transistors to establish a testing condition with respect to a signal relationship between a first current flow and a second current flow;
  receiving signal samples from said DUT at said sense transistors, said signal samples being applied to dictate said signal relationship between said first current flow and said second current flow; and
  determining said operational status of said DUT on a basis of said signal relationship after said signal samples have been applied.

19. The method of claim 18 wherein providing said transistors includes providing four said transistors in a parallel configuration, including two said control transistors and two said sense transistors.

20. The method of claim 19 further comprising providing a first current path for conducting said first current flow and a second current path for conducting said second current flow, including connecting said first current path to source/drain regions of any two said transistors and connecting said second current path to source/drain regions of the other two said transistors.

21. The method of claim 18 wherein receiving said reference signals includes receiving constant voltages for controlling current flows that are conducted through said control transistors, said reference signals defining a plurality of regions in an x-y plane.

22. The method of claim 21 wherein receiving said signal samples includes receiving analog signals for controlling current flows that are conducted through said sense transistors, said signal samples defining a coordinate in said x-y plane.

23. The method of claim 22 further comprising establishing said coordinate as being in one of said regions in said x-y plane by identifying said signal relationship, said signal relationship being either one in which said first current flow is greater than said second current flow or one in which said second current flow is greater than said first current flow.

24. The method of claim 18 further comprising accelerating said variation in said signal relationship.

* * * * *